US 6,566,969 B2

(12) United States Patent
Matuo et al.

(10) Patent No.: US 6,566,969 B2
(45) Date of Patent: May 20, 2003

(54) HIGH FREQUENCY DUAL BAND OUTPUT OSCILLATOR

(75) Inventors: Nobuaki Matuo, Suzaka (JP); Alejandro Puel, Suzaka (JP)

(73) Assignee: Fujitsu Media Devices Limited, Nagano (JP)

(*) Notice: Subject to any disclaimer, the term of this patent is extended or adjusted under 35 U.S.C. 154(b) by 0 days.

(21) Appl. No.: 09/936,666

(22) PCT Filed: Jan. 30, 2001

(86) PCT No.: PCT/JP01/00601

§ 371 (c)(1),
(2), (4) Date: Sep. 13, 2001

(87) PCT Pub. No.: WO01/65679

PCT Pub. Date: Sep. 7, 2001

(65) Prior Publication Data

US 2003/0067363 A1 Apr. 10, 2003

(30) Foreign Application Priority Data

Feb. 29, 2000 (JP) ............................ 2000-052663

(51) Int. Cl.[7] .......................... H03B 27/00; H03B 5/02; H03B 5/12
(52) U.S. Cl. ..................... 331/49; 331/179; 331/117 R; 331/46; 331/74; 331/76
(58) Field of Search .............................. 331/49, 46, 74, 331/76, 179, 117 R

(56) References Cited

U.S. PATENT DOCUMENTS 5,200,713 A * 4/1993 Grace et al. ............ 331/117 D
6,288,615 B1 * 9/2001 Kobayashi ................... 331/49

FOREIGN PATENT DOCUMENTS

| JP | S50-26222 | 8/1975 |
| JP | S58-99926 | 7/1983 |
| JP | H1-236802 | 9/1989 |
| JP | H9-294018 | 11/1997 |
| JP | H10-163750 | 6/1998 |
| JP | H10-178316 | 6/1998 |
| JP | H11-298242 | 10/1999 |

* cited by examiner

*Primary Examiner*—Arnold Kinkead
(74) *Attorney, Agent, or Firm*—Koda & Androlia

(57) ABSTRACT

A voltage control oscillator used in mobile communication systems such as cellular phones and video machines. An oscillation output of the first output oscillation circuits (1a) enters a broad band buffer amplifier circuit (4) through a stage-to-stage coupling capacitor (22) and an oscillation output of the second output oscillation circuit (1b) enters the broad band buffer amplifier circuit (4) through frequency selective filters (3a, 3b) and the stage-to-stage coupling capacitor (22). On/off operation of a control voltage of a switch terminal (2) installed on the first or second output oscillation circuit outputs selectively an oscillation signal from the first or second output oscillation circuit.

2 Claims, 5 Drawing Sheets

HIGH FREQUENCY DUAL BAND OUTPUT OSCILLATOR

TECHNICAL FIELD

The present invention relates to a voltage control oscillator (VCO) used in the mobile communication systems such as cellular phones and car phones, and visual machines and satellite installations, in more particular, to a high frequency dual band output oscillator used by changing an operation and non-operation of the frequency band due to externally applied control voltage.

BACKGROUND TECHNOLOGY

Nowadays, various communication machines such as cellular phones usable by plural communication systems called a dual mode have been popularized, so that different frequency bands are used and a number of the kind of frequency increases, resulting in a broadening of the frequency bands of voltage control oscillators of local oscillating machines determining the frequency to be used.

In particular, the dual modes cellular phones are necessary to oscillate a plurality of frequencies and it is necessary to cover the necessary frequency band by using a plurality of voltage control oscillators of single mode, or a voltage control oscillator of dual mode.

For example, in the USA AMPS system and DMA system, and in Europe GSM system and DCS system are employed as frequency band systems.

By the way, Japan Patent Laid-open gazette H9(1997)-294018 and U.S. Pat. No. 5,852,384 describe a high frequency dual band oscillator circuit generating signals of two different frequency bands.

The conventional high frequency dual band oscillator circuit described in these official gazettes has a first oscillator circuit functioning an oscillation operation in the first frequency band, a second oscillator circuit functioning an oscillation operation in the second frequency band, and a buffer amplifier circuit into which an output of the first oscillator circuit enters through the first stage-to-stage coupling capacitor and into which an output of the second oscillator circuit enters through the second stage-to-stage coupling capacitor.

When an oscillation output is taken out of the first frequency band, it is necessary to apply a base voltage of the oscillation transistor constructing the first oscillation circuit through the first base bias control terminal to the conventional high frequency dual band oscillator circuit. If another base voltage of an oscillation transistor constructing the second oscillator circuit is not applied to the conventional high frequency dual band oscillator circuit from the second base bias control terminal, only the first oscillation circuit becomes active generating an oscillation output, this oscillation output is amplified by the buffer amplifier circuit through the first stage-to-stage coupling capacitor and the output amplified is taken out of the high frequency output terminal.

While, in order to take out an oscillation output from the second frequency band, it is necessary to apply a base voltage of the second base bias control terminal to the conventional high frequency dual band oscillation circuit. Because that a base voltage is not applied from the first base bias control terminal to the oscillation circuit, only the second oscillation circuit becomes operative condition and an oscillation output of the second oscillation circuit is amplified in the buffer amplifier circuit through the second stage-to-stage coupling capacitor and the amplified oscillation output is taken out through a high frequency output terminal.

According to the high frequency dual band oscillation circuit of an old type, two buffer amplifier circuits were necessary for two frequency bands respectively. In the conventional high frequency dual band oscillation circuit described in the two official gazettes, the oscillation output is amplified with one buffer amplifier circuit.

The conventional high frequency dual band oscillation circuit above is able to decrease the number of the buffer amplifier circuit from two to one, however two of the first and second base bias control terminal are necessary and additionally two logic circuits for controlling respective these base bias control terminals and two control circuits for controlling respective two tuning voltage supply terminals are necessary to have a function for controlling a timing of an operation and non-operation of the first and second oscillation circuits and also every oscillation circuit is necessary to have the emitter resistor of the oscillation transistor. As a result, the number of parts increases prohibiting whole size of the mechanism from miniaturizing and a power for the external logic and control circuits is necessary disadvantageously increasing the power to be consumed.

Consequently, the present invention provides the high frequency dual band oscillation circuit of no fault, having parts of small number which is attained by making the circuits in common and switches of simple structure, resulting in a small size of the whole machine, a low consuming power, and a low manufacturing cost

DESCRIPTION OF THE INVENTION

The high frequency dual band output oscillator of the present invention has a first output oscillation circuit operating in an oscillation manner at a first frequency band, a second output oscillation circuit operating in an oscillation manner at a second frequency band, one broad band buffer amplifier circuit into which an oscillation output of the first output oscillation circuit enters through a stage-to-stage coupling element and an oscillation output of the second output oscillation circuit enters through frequency selective filters and the stage-to-stage coupling element, and a switch terminal controlling an operation or a non-operation of one of the first and second output oscillation circuits. The broad band buffer amplifier circuit is constructed with a buffer amplifier circuit and an impedance matching circuit placed at the back stage of the buffer amplifier circuit, and the high frequency dual band output oscillator has a structure so constructed as to selectively output an oscillation signal from the first and second output oscillation circuit when a control voltage is externally applied or not applied to the switch terminal. As a result, two base bias control terminals which are necessary to each output oscillation circuit and two logic circuits for controlling these base bias control terminals, which circuits are necessary, have been necessary to the conventional high frequency dual band oscillation circuit.

According to the high frequency dual band oscillation circuit of the present invention, it is possible to reduce the number of such logic circuits and base bias control terminals to one, respectively decreasing the number of parts.

According to the high frequency dual band output oscillator of the present invention, the emitter side of an oscillation transistor of one of the first and second output oscillation circuits is connected with an emitter resistor or another oscillation transistor through an inductor of the frequency selective filter, and another emitter resister of another oscillation transistor is commonly used for the emitter resistor of the former oscillation transistor. Consequently, it is possible to reduce the number of two emitter resistors of the oscillation transistor, which are necessary to each of two oscillation circuits to one, and reduce the number of whole parts of the conventional high frequency dual band output oscillator. As a result, according to the present invention, it is possible to miniaturize the machine size, decrease the manufacturing cost, and saving the power operating the installation.

BEST FORM FOR EMBODYING THE INVENTION

In order to explain in more detail the present invention, it is described with reference to the accompanying drawings.

Figure 1:
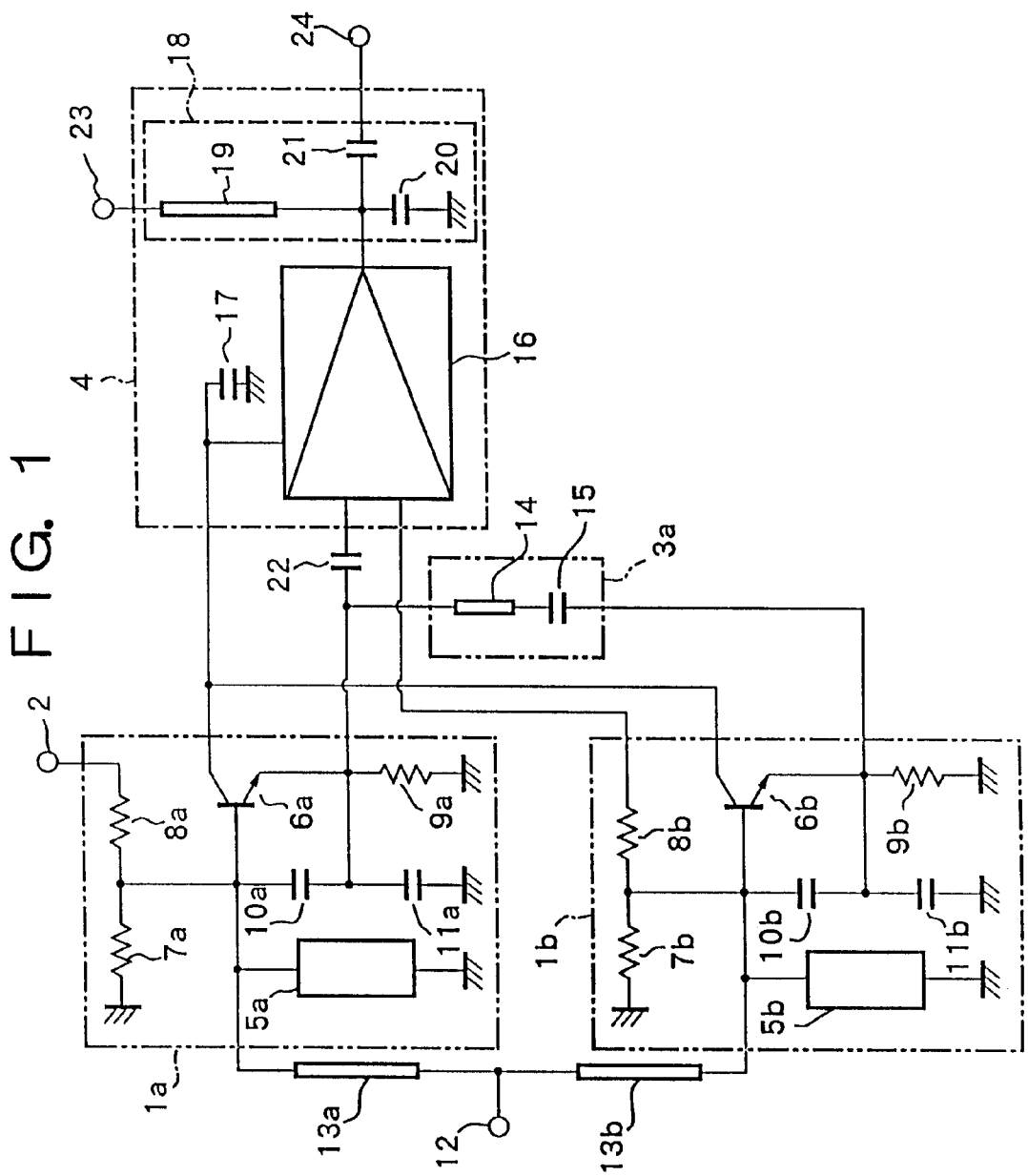
FIG. 1 is an electric circuitry of the high frequency dual band output oscillator of the first embodiment according to the present invention.

In FIG. 1, the high frequency dual band output oscillator according to the present invention has the first and second output oscillation circuits 1a and 1b, respectively effecting oscillation operations in the first and second frequency bands, a switch terminal 2 provided in the first output circuit 1a, a frequency selective filter 3a, and a broad band buffer amplifier circuit 4.

These output oscillation circuits 1a and 1b respectively are constituted with resonators 5a and 5b, oscillation transistors 6a and 6b used as oscillation elements, bias resisters 7a and 8a, 7b and 8b, emitter resisters 9a and 9b, base-emitter coupling capacitors 11a and 11b.

The tuning voltage impressed on a tuning voltage supply terminal 12 is given to the resonators 5a and 5b through high frequency cut-off inductances 13a and 13b.

The frequency selective filter 3a is constructed by a series resonator circuits of a frequency circuits of a frequency selective filter inductance 14 and a frequency selective filter capacitor 15. A broad band buffer amplifier circuit 4 is constructed with a buffer amplifier circuit 16, an impedance controlling capacitor 17, and an impedance matching circuit 18 at a back stage of them. The impedance matching circuit 18 is constructed by a high frequency cut-off inductance 19 and output impedance matching capacitors 20 and 21.

The broad band buffer amplifier circuit 4 is connected to the first output oscillation circuit 1a through a stage-to-stage coupling capacitors 22, as well as is connected to the second output oscillation circuit 1b through the stage-to-stage coupling capacitor 22 and the frequency selective filter 3a. 23 denotes a power supply terminal and 24 denotes a high frequency output terminal.

The resonator 5a, the first oscillation transistor 6a, the base-emitter coupling capacitor 10a, the emitter-ground coupling capacitor 11a, bias resisters 7a and 8a, and an emitter resistance 9a, respectively constituting the first output oscillation circuit 1a, have their volume values determined so as to attain an oscillating condition that is most suitable to the first frequency band and to carry out an oscillation operation of the first output oscillation circuit 1a in the first oscillation frequency band in correspond with the voltage to be applied to the tuning voltage supply terminal 12.

Also, the resonator 5b, the second oscillation transistor 6b, the base-emitter coupling capacitor 10b, the emitter ground coupling capacitor 11b, the bias resistors 7a and 8b, and the emitter resistance 9b, respectively constituting the second output oscillation circuit 1b, have their volume values determined so as to attain an oscillation condition that is most suitable to the second frequency band and to make the second output oscillation circuit 1b carry out an oscillation operation in correspond with the voltage to be supplied to the tuning voltage terminal 12.

In addition, for example, a LC resonation circuit or resonation element is used for the resonators 5a and 5b. These resonators 5a and 5b includes for example a varactor diode or a piezo element, and use a circuit or an element adapted to change their oscillation frequencies according to the change of tuning voltage applied to the tuning voltage supply terminal 12.

Furthermore, the tuning voltage supply terminal 12 for the first output oscillation circuit 1a and the second output oscillation circuit 1b is the common element for them.

In case that tuning voltage supply terminals are connected to respective output oscillation circuits, it is possible to drive both the output oscillation circuits by using two different tuning voltage ranges, so it is advantageous to be able to set the tuning voltage ranges which are respectively easy to use in respective output oscillation circuits. However, logic circuits are necessary in respective output oscillation circuits in order to control the tuning voltage.

On the contrary, when a common tuning voltage supply terminal is used and one tuning voltage is used to control two output oscillation circuits, setting most preferably the part constituting the first and second output oscillation circuits 1a and 1b so as to oscillate the desired frequency band width by using one tuning voltage range makes possible to constitute the logic circuit controlling the tuning voltage by means of one part. Accordingly, it is possible to miniaturize the whole size of the installation.

When a predetermined voltage of the power supply terminal 23 is impressed on the high frequency dual band output oscillator constituted as described above and a control voltage of the switch terminal 2 is in off condition, the second output oscillation circuit 1b and the broad band buffer amplification circuit 4 are in their operative conditions and the oscillation output from the second output oscillation circuit 1b is input to the broad band buffer amplifier circuit 4 through the frequency selective filter 3 and the stage-to-stage coupling capacitor 22.

At this time, the frequency selective filter 3a functions as a band-pass filter through which an oscillation frequency of the second output oscillation circuit 1b and also the first output oscillation circuit 1a is in its non-operative condition, so that an impedance of the first output oscillation circuit 1a, with reference to the frequency selective filter 3a, is a relatively high comparing to the stage-to-stage coupling capacitor 22 and resultantly an oscillation signal of the second output oscillation circuit 1b is input to the side of the stage-to-stage coupling capacitor 22 without inputting to the first output oscillation circuit 1a, then is amplified by the broad band buffer amplifier circuit 4 and is output from the high frequency output terminal 24.

While, in case that a control voltage of the switch terminal 2 is on, the first and second output oscillation circuits 1a and 1b, and the broad band buffer amplification circuit 4 are in the operative condition. Because that an impedance of the stage-to-stage coupling capacitor 22 becomes lower than that of the frequency selective filter 3a, an oscillation output from the first output oscillation circuit 1a does not enter the second output oscillation circuit 1b, but enters the broad band buffer amplification circuit 4 through the stage-to-stage coupling capacitor 22, is amplified, and is output from the high frequency output terminal 24.

The first output oscillation circuit 1a is in its operative condition and the impedance of the first output oscillation circuit 1a is lower than that of the stage-to-stage coupling capacitor 22, so that the oscillation output of the second output oscillation circuit 1b passes through the frequency selective filter 3a, but it does not enter the side of the stage-to-stage coupling capacitor 22.

When a control voltage of the switch terminal 2 is on and sufficiently high, the second output oscillation circuit 1b becomes non-operative condition. Because that the second output oscillation circuit 1b is off at this time, an impedance of the frequency selective filter 3a and after the filter 3a becomes of a level higher than that of the stage-to-stage coupling capacitor 22 and an oscillation output of the first output oscillation circuit 1a enters the broad band buffer amplifier circuit 4 through the stage-to-stage coupling capacitor.

As described above, by means of a simple structure consisting of the frequency selective filter 3a of a series oscillation circuit and one switch terminal 2, it is possible to selectively output one of these oscillation signals of the first and second output oscillation circuits 1a and 1b.

Figure 2:
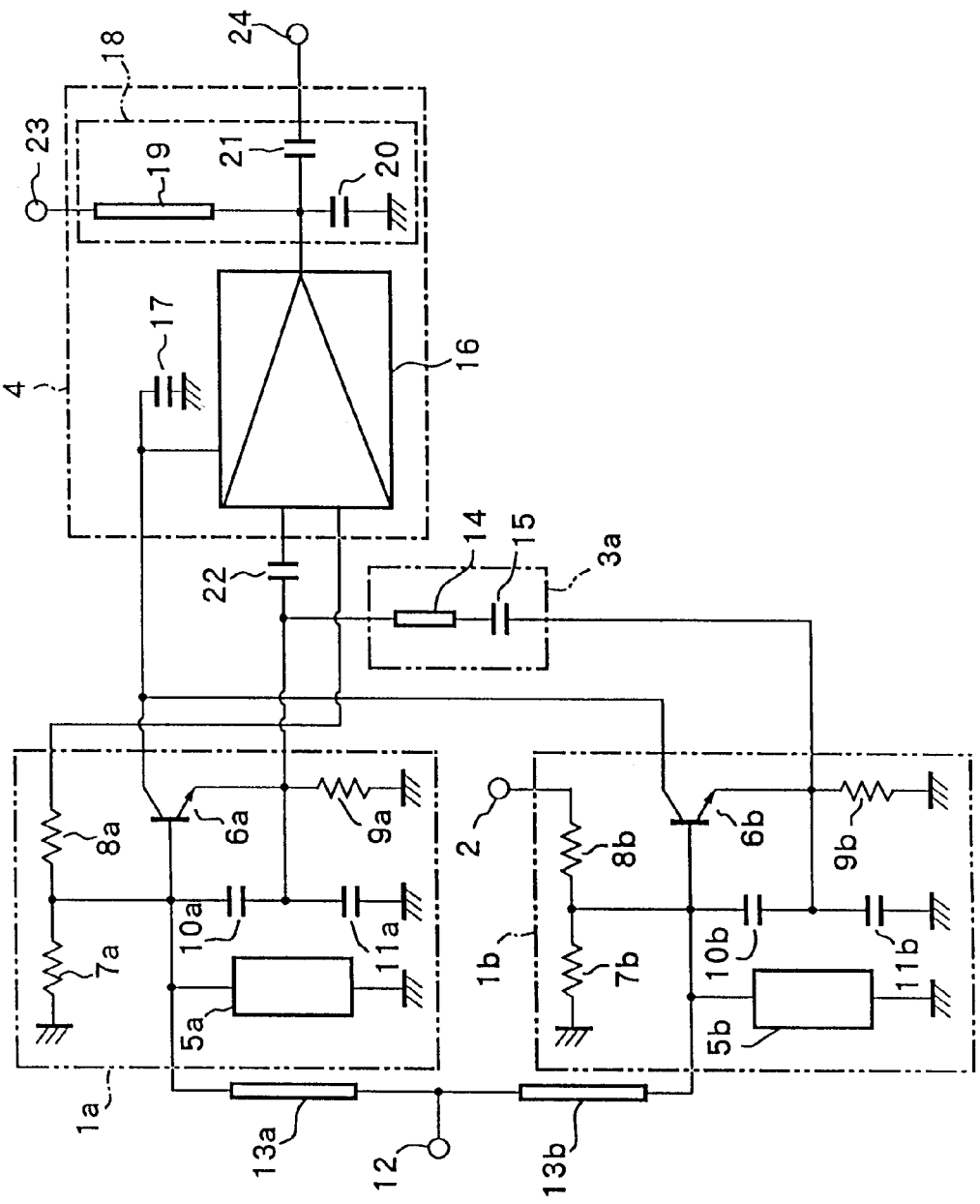
FIG. 2 is an electric circuitry of the high frequency dual band output oscillator of the second embodiment.

FIG. 2 shows a second embodiment of the present invention in which the switch terminal 2 is installed on the second output oscillation circuit 1b in, spite of the first output oscillation circuit 1a of the first embodiment.

The structure shown in FIG. 2 is identical with that of FIG. 1 except for the position of the switch terminal 2. Consequently, the portions similar to that of FIG. 1 have the reference numbers similar to that of FIG. 1 and an explanation for them is omitted from the following description.

According to the second embodiment, when a predetermined voltage from the power terminal 23, is applied to the high frequency dual band output oscillator shown in FIG. 2, the first output oscillation circuit 1a and the broad band buffer amplification circuit 4 become an operative condition while a control voltage of the switch terminal 2 is off. Resultantly, an impedance of the stage-to-stage coupling capacitor 22 becomes of a level lower than that of the frequency selective filter 3a, so that the oscillation output of the first output oscillation circuit 1a fails to enter the second oscillation circuit 1b and enters the broad band buffer amplification circuit 4 through the stage-to-stage coupling capacitor 22, and is amplified and outputs from the high frequency output terminal 24.

On the contrary, when the control voltage of the switch terminal 2 is on and sufficiently high, the second output oscillation circuit 1b and the broad band buffer amplification circuit 4 becomes of the active condition and the first output oscillation circuit 1a becomes of non-active condition. Because that the first output oscillation circuit 1a is in an off condition at this time, it is a high impedance than that of the stage-to-stage coupling capacitor 22. As a result, an oscillation output of the second output oscillation circuit 1b enters the broad band buffer amplification circuit 4 through the frequency selective filter 3a and the stage-to-stage coupling capacitor 22, amplified, and outputs through the high frequency output terminal 24.

Figure 3:
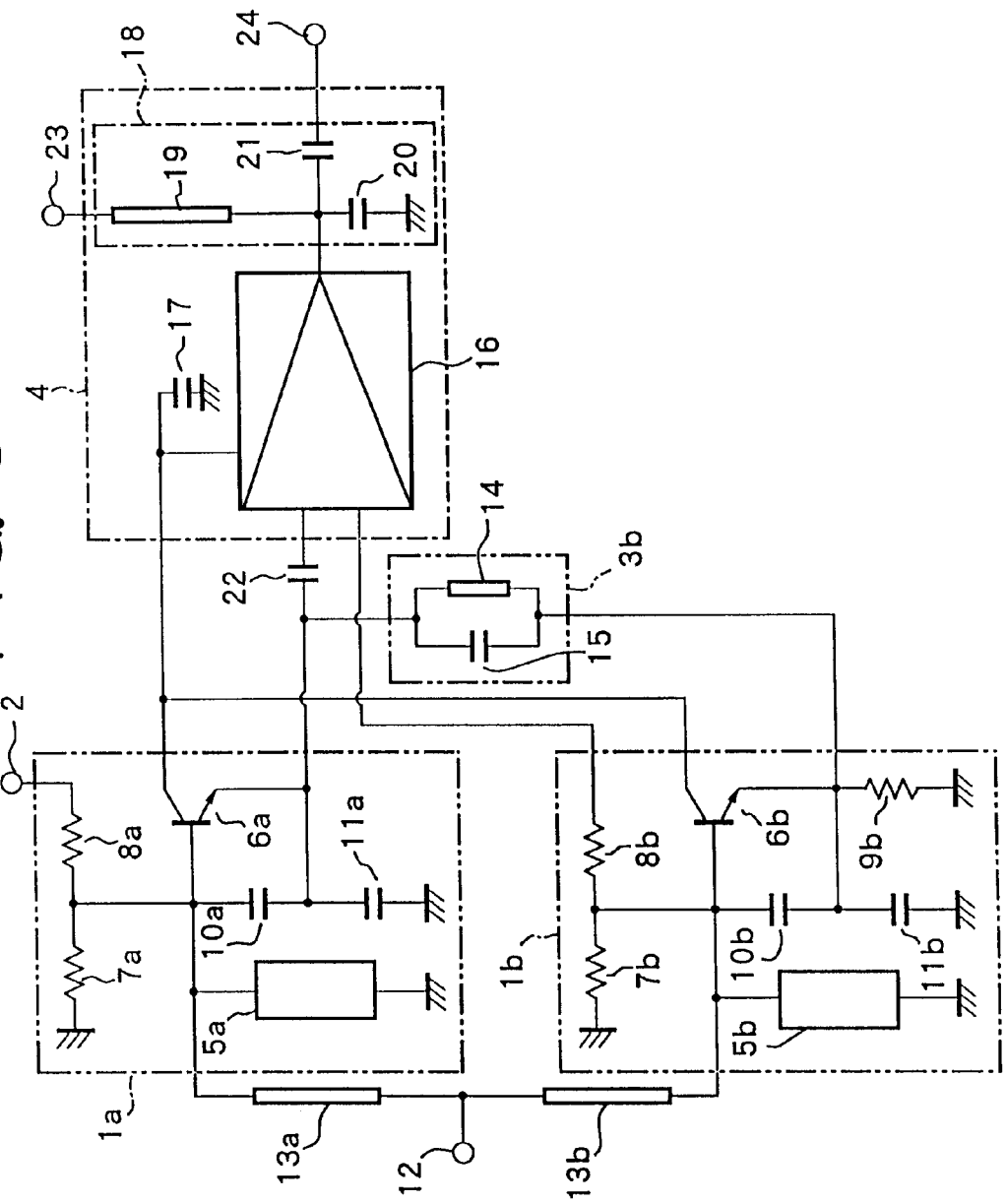
FIG. 3 is an electric circuitry of the high frequency dual band output oscillator of the third embodiment.

FIG. 3 shows the third embodiment of the present invention. The high frequency dual band output oscillator of the third embodiment has the high frequency selective filter 3b which is constructed by a frequency selecting inductor 14 and a frequency selecting capacitor 15. The inductor 14 and the capacitor 15 construct a parallel oscillation circuit. An emitter of an oscillation transistor 6a of the first output oscillation circuit 1a is connected with an emitter resistor 9b of an oscillation transistor 6b of the second output oscillation circuit 1b through the frequency selecting inductor 14 of the frequency selective filter 3b, so that the emitter resister 9a of the first output oscillation circuit 1a, which resistor is shown in FIGS. 1 and 2 is able to be omitted from the first output oscillation circuit 1a and only the emitter resistor 9a of the second output oscillation circuit 1b is commonly used. Other structure of the third embodiment is identical with the corresponding structure of the first and second embodiments shown in FIGS. 1 and 2. Accordingly, the portions of the third embodiment which portions corresponding to the particular portions of the first and second embodiments have the same reference numerals and an explanation for them is omitted.

According to the third embodiment of the present invention, when a predetermined voltage is applied to the high frequency dual band output oscillator through the power terminal 23 and a control voltage of the switch terminal 2 is off, the second output oscillation circuit 1b and the broad band buffer amplifier circuit 4 are activated and an oscillation output of the second output oscillation circuit 1b enters the broad band buffer amplifier circuit 4 through the frequency selective filter 3b and the stage-to-stage coupling capacitor 22. The frequency selective filter 3b is constructed so as to pass an oscillation frequency of the second output oscillation circuit 1b at this time. In other words, the frequency selective filter 3b functions as a low-pass filter. Because that the first output oscillation circuit 1a is its non-operative state, the impedance of the first output oscillation circuit 1a is high comparing to the stage-to-stage coupling capacitor 22 and seeing it from the frequency selective filter 3b, the oscillation output from the second output oscillation circuit 1b does not enter the first output oscillation circuit 1a, however enters the side of the stage-to-stage coupling capacitor 22, and is amplified by the broad band buffer amplifier circuit 4 and the output from the high frequency output terminal 24.

While, when a control voltage of the switch terminal 2 is on, the first and second output oscillation circuits 1a and 1b, and the broad band buffer amplifier circuit 4 operate, and an oscillation output of the first output oscillation circuit 1a fails to enter the second output oscillation circuit 1b since the impedance of the stage-to-stage coupling capacitor 22 becomes low comparing to the frequency selective filter 3b. And the oscillation output from the first output oscillation circuit 1a enters the broad band buffer amplifier circuit 4 through the stage-to-stage coupling capacitor 22.

The oscillation output of the second output oscillation circuit 1b passes through the frequency selective filter 3b, however it fails to enter the side of the stage-to-stage coupling capacitor 22, since the first output oscillation circuit 1a is in its operative condition and the impedance of the first output oscillation circuit 1a becomes low comparing to the stage-to-stage coupling capacitor 22.

When a control voltage of the switch terminal 2 is on and sufficiently high, the first output oscillation circuit 1a operates and the second output oscillation circuit 1b does not function. Because the second output oscillation circuit 1b is off at this time, the frequency selective filter 3b and after this filter have a high impedance comparing to the stage-to-stage coupling capacitor 22 and an oscillation output of the first output oscillation circuit 1a enters the broad band buffer amplifier circuit 4 through the stage-to-stage coupling capacitor 22.

Figure 4:
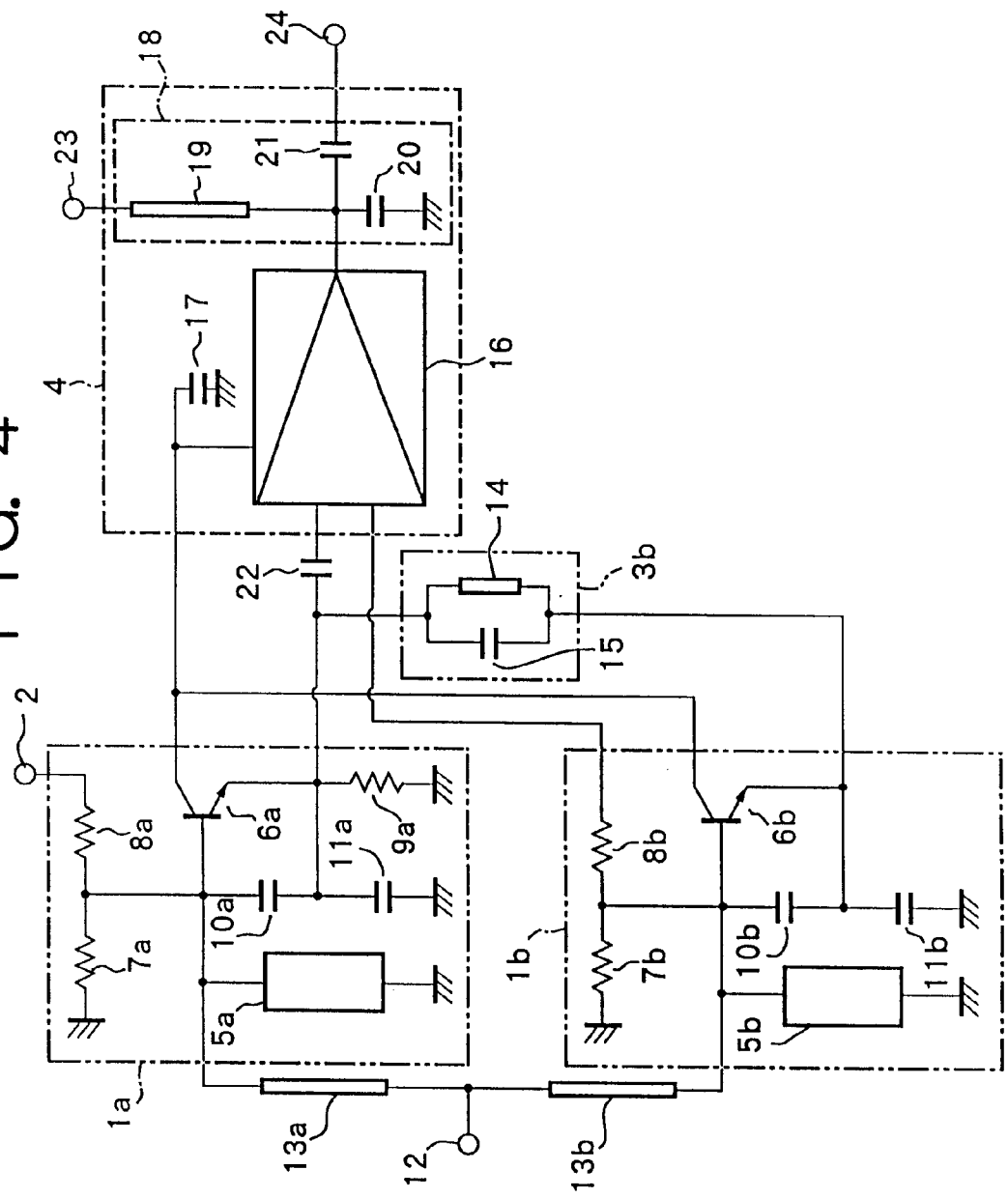
FIG. 4 is an electric circuitry of the high frequency dual band output oscillator of the fourth embodiment.

FIG. 4 shows the fourth embodiment of the present invention. The high frequency dual band output oscillator of the fourth embodiment is constituted by omitting the emitter resister 9b from the second output oscillation circuit 1b in the high frequency dual band output oscillator according to the third embodiment shown in FIG. 3 and providing an emitter resister 9a of the first output oscillation circuit 1a of the first and second output oscillation circuit 1a in the fourth output oscillation circuit 1a of the fourth embodiment of the present invention. Consequently, the portions of the fourth embodiment corresponding to the portions of the third embodiment have the same reference numerals and their structures and operative explanations for them are omitted from the following descriptions.

Figure 5:
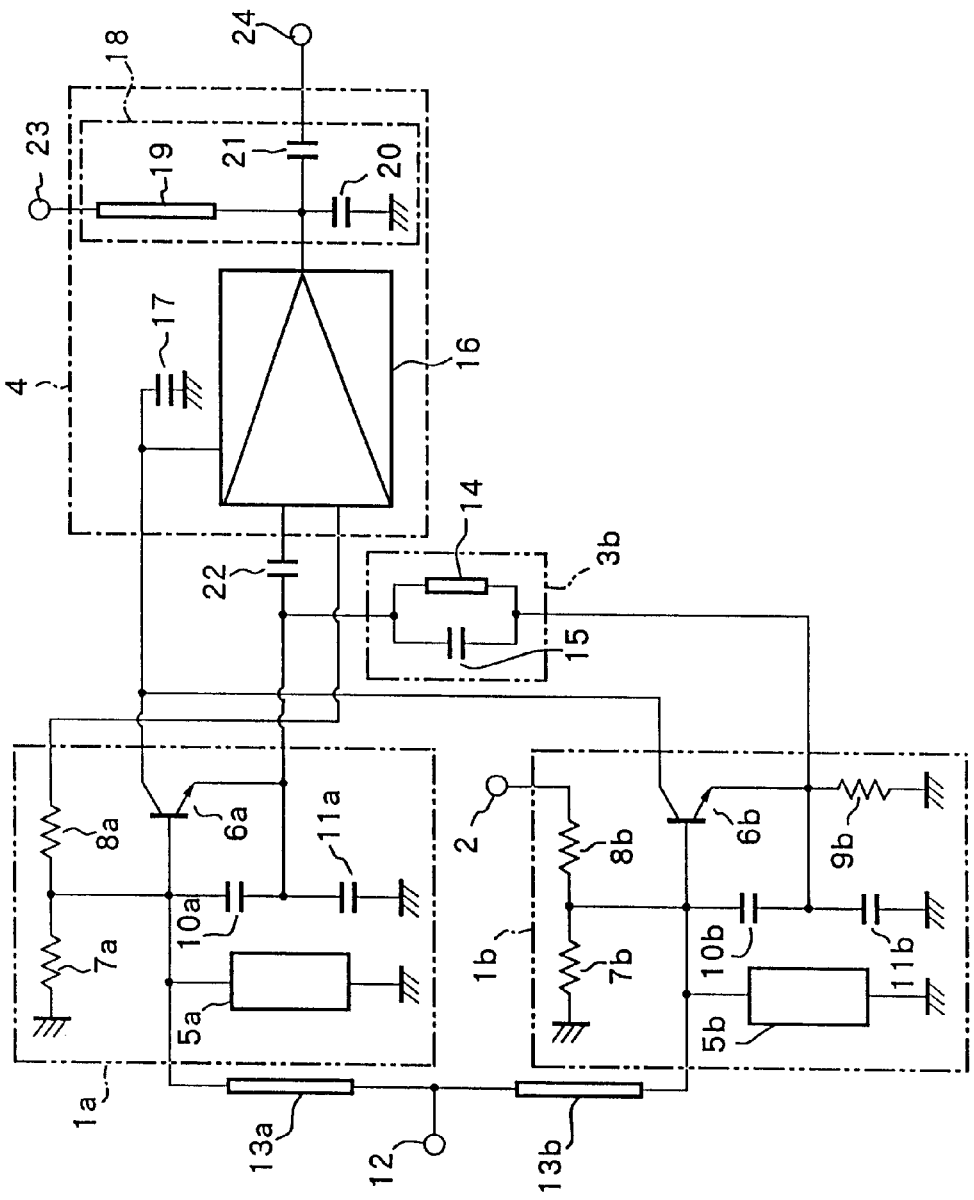
FIG. 5 is an electric circuitry of the high frequency dual band output oscillator of the fifth embodiment.

FIG. 5 shows the fifth embodiment of the present invention. The high frequency dual band output oscillator of the fifth embodiment is constructed by providing the switch terminal 2 of the first output oscillation circuit 1a in the second output oscillation circuit 1b shown in FIG. 3, so the whole structure shown in this view is identical with that of FIG. 3 except for the position of the switch terminal 2.

Accordingly, the portions of the fifth embodiment corresponding to the portions of the third embodiment have the same reference numerals and the explanations for them will be omitted.

Concerning the operation of the high frequency dual band output oscillator according to the fifth embodiment, the operative explanation of the frequency selective filter 3a is used for the frequency selective filter 3b in the fifth embodiment and other construction of FIG. 2 is used in the fifth embodiment, so that the explanation for the construction will be omitted.

Industrial Field the Invention is Applied

As described above, the high frequency dual band output oscillator of the present invention is used in a mobile communication system such as cellular phones and automobile phones, or video machines, satellite communication machines, miniaturizing the whole structure of the mechanics and reducing the manufacturing cost and a use power.

What is claimed is:

1. A high frequency dual band output oscillator comprising:

an oscillation transistor (6a) providing a first output oscillation circuit (1a) operating in an oscillation manner at a first frequency band, an oscillation transistor (6b) providing a second output oscillation circuit (1b) operating in an oscillation manner at a second frequency band, one broad band buffer amplifier circuit (4) into which an oscillation output of said first output oscillation circuit (1a) enters through a stage-to-stage coupling element (22) and an oscillation output of said second output oscillation circuit (1b) enters through a frequency selective filters (3a, 3b) and said stage-to-stage coupling element (22), said frequency selective filter (3a, 3b) comprising a frequency selective filter inductance (14) and a frequency selective filter capacitor (15), and a single switch terminal (2) controlling an operation or a non-operation of one of said first and second output oscillation circuits (1a, 1b), wherein an oscillation signal from said first or second output oscillation circuit is selectively outputted when a base voltage of said oscillation transistors (6a, 6b) is respectively controlled by an on-and-off of a control voltage that is externally applied to said switch terminal (2) and an operation and a non-operation of said oscillation transistors (6a, 6b) are exchanged.

2. The high frequency dual band output oscillator according to claim 1, wherein an emitter of either one of said oscillation transistors (6a or 6b) is connected to an emitter resistor (9b or 9a) of another one of said oscillation transistor (6b or 6a) through said inductance (14) of said frequency selective filter (3b), and an emitter resistor (9a or 9b) of either one of oscillation transistor (6a or 6b) is used commonly with an emitter resistor (9b or 9a) of another one of oscillation transistor (6b or 6a).

* * * * *